(12) United States Patent
Hwang et al.

(10) Patent No.: US 11,728,419 B2
(45) Date of Patent: Aug. 15, 2023

(54) HIGH ELECTRON MOBILITY TRANSISTOR

(71) Applicant: Samsung Electronics Co., Ltd., Suwon-si (KR)

(72) Inventors: Injun Hwang, Yongin-si (KR); Jaejoon Oh, Seongnam-si (KR); Soogine Chong, Seoul (KR); Jongseob Kim, Seoul (KR); Joonyong Kim, Seoul (KR); Junhyuk Park, Pohang-si (KR); Sunkyu Hwang, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 150 days.

(21) Appl. No.: 17/082,478

(22) Filed: Oct. 28, 2020

(65) Prior Publication Data
US 2022/0013659 A1 Jan. 13, 2022

(30) Foreign Application Priority Data
Jul. 8, 2020 (KR) .................. 10-2020-0084343

(51) Int. Cl.
*H01L 29/778* (2006.01)
*H01L 29/66* (2006.01)
(Continued)

(52) U.S. Cl.
CPC ...... *H01L 29/7786* (2013.01); *H01L 29/2003* (2013.01); *H01L 29/402* (2013.01); *H01L 29/66462* (2013.01)

(58) Field of Classification Search
CPC ... H01L 29/122–127; H01L 29/15–158; H01L 29/2003; H01L 29/205;
(Continued)

(56) References Cited

U.S. PATENT DOCUMENTS 8,324,037 B1 * 12/2012 Shih .................. H01L 29/66462
257/E29.246
8,404,508 B2 3/2013 Lidow et al.
(Continued)

FOREIGN PATENT DOCUMENTS

| CN | 102013437 A | * | 4/2011 | ....... H01L 29/41758 |
| KR | 10-1616157 B1 | | 4/2016 | |
| KR | 10-1927408 B1 | | 3/2019 | |

OTHER PUBLICATIONS

Zhang, Semiconductor device ad manufacturing method thereof (2011), machine translation of CN 102013437, pp. 1-8. (Year: 2011).*

*Primary Examiner* — Natalia A Gondarenko
(74) *Attorney, Agent, or Firm* — Harness, Dickey & Pierce, P.L.C.

(57) ABSTRACT

A high electron mobility transistor (HEMT) includes a channel layer comprising a group III-V compound semiconductor; a barrier layer comprising the group III-V compound semiconductor on the channel layer; a gate electrode on the barrier layer; a source electrode over gate electrode; a drain electrode spaced apart from the source electrode; and a metal wiring layer. A same layer of the metal wiring layer includes a gate wiring connected to the gate electrode, a source field plate connected to the source electrode, and a drain field plate connected to the drain electrode.

20 Claims, 11 Drawing Sheets

(51) Int. Cl.
*H01L 29/40* (2006.01)
*H01L 29/20* (2006.01)

(58) Field of Classification Search
CPC ......... H01L 29/42356; H01L 29/66431; H01L 29/66462; H01L 29/41766; H01L 29/778–7789; H01L 29/7786; H01L 29/7787; H01L 29/7839; H01L 29/806; H01L 29/812; H01L 29/402; H01L 29/404; H01L 29/1066; H01L 29/7783; H01L 23/4824; H01L 23/4855; H01L 23/492; H01L 23/481; H01L 23/482; H01L 23/5384; H01L 2924/13064; H01L 29/0696; H01L 29/41775; H01L 29/42316; H01L 29/4916
USPC .............................. 257/183, 192, 194, 76, 77
See application file for complete search history.

(56) References Cited

U.S. PATENT DOCUMENTS

| | | | |
|---|---|---|---|
| 8,890,168 B2 | 11/2014 | Lidow et al. | |
| 9,231,093 B2 | 1/2016 | Jeon et al. | |
| 9,306,014 B1 | 4/2016 | Kudymov et al. | |
| 2012/0280280 A1* | 11/2012 | Zhang | H01L 29/4238 257/E21.403 |
| 2014/0363937 A1 | 12/2014 | Chang et al. | |
| 2015/0263107 A1* | 9/2015 | Kobayashi | H01L 21/823437 257/367 |
| 2016/0087074 A1* | 3/2016 | Prechtl | H01L 23/53223 438/652 |
| 2017/0154839 A1* | 6/2017 | Lin | H01L 29/205 |
| 2019/0027593 A1 | 1/2019 | Liao et al. | |
| 2019/0109195 A1 | 4/2019 | Tomomatsu et al. | |
| 2019/0326427 A1* | 10/2019 | Kinzer | H01L 29/7786 |
| 2021/0273065 A1* | 9/2021 | Brun | H01L 29/2003 |

* cited by examiner

HIGH ELECTRON MOBILITY TRANSISTOR

CROSS-REFERENCE TO RELATED APPLICATION

This application is based on and claims priority under 35 U.S.C. § 119 to Korean Patent Application No. 10-2020-0084343, filed on Jul. 8, 2020, in the Korean Intellectual Property Office, the disclosure of which is incorporated by reference herein in its entirety.

BACKGROUND

1. Field

The present disclosure relates to high electron mobility transistors (HEMTs) having a reduced gate resistance.

2. Description of Related Art

Nitride semiconductor devices may be used as, for example, power devices for power control. One example of a power device is a high electron mobility transistor (HEMT). The HEMT may include a channel layer, a barrier layer on the channel layer, and 2-dimensional electron gas (2DEG) used as a carrier in the channel layer. As the 2DEG is used as a carrier, the electron mobility of HEMT is greater than that of a general transistor. The HEMT may include a compound semiconductor with a wide band gap. Therefore, the breakdown voltage of the HEMT may be greater than that of the general transistor. The breakdown voltage of the HEMT may increase in proportion to the thickness of the compound semiconductor layer including the 2DEG, for example, a GaN layer.

The HEMT may include semiconductor layers with different band gaps. In the HEMT, a semiconductor layer with a large band gap acts as a donor. The 2DEG may be formed in a semiconductor layer with a small band gap by the semiconductor layer with the large band gap. In the HEMT, the 2DEG may be used as a channel.

In addition, a source electrode and a drain electrode are in ohmic contact on the barrier layer. In this regard, a high-temperature process may be required to reduce ohmic resistance.

SUMMARY

Provided are high electron mobility transistors (HEMTs) having a reduced gate resistance.

Additional aspects will be set forth in part in the description which follows and, in part, will be apparent from the description, or may be learned by practice of the presented embodiments of the disclosure.

According to an embodiment, a high electron mobility transistor (HEMT) includes a channel layer including a group III-V compound semiconductor; a barrier layer on the channel layer and including the group III-V compound semiconductor; a gate electrode on the barrier layer; a source electrode over the gate electrode; a drain electrode spaced apart from the source electrode, and a metal wiring layer. The metal layer wiring includes a gate wiring connected to the gate electrode, a source field plate connected to the source electrode, and a drain field plate connected to the drain electrode. The gate wiring, the source field plate, and the drain field plate may be arranged in a same layer.

In some embodiments, a distance from the source field plate to the drain electrode may be shorter than a distance from the gate electrode to the drain electrode.

In some embodiments, a distance from the source electrode to the drain electrode may be shorter than a distance from the gate electrode to the drain electrode.

In some embodiments, the gate electrode may further at least one of Ti, TiN, TiAl, or W.

In some embodiments, the channel layer may further GaN, InGaN, or AlGaN.

In some embodiments, the barrier layer may further AlN, AlGaN, AlInN, or AlInGaN.

In some embodiments, the HEMT may further include a p-GaN layer between the barrier layer and the gate electrode.

In some embodiments, the gate electrode and the p-GaN layer may be in direct contact with each other and may have a self-align gate structure.

In some embodiments, the gate electrode may include at least one first hole and landing pads provided on both sides of the at least one first hole.

In some embodiments, the HEMT may further include a source contact in the at least one first hole and the source contact may connect the barrier layer and the source electrode to each other.

In some embodiments, the source electrode may include at least one second hole.

In some embodiments, the at least one second hole may correspond to the landing pads.

In some embodiments, the HEMT may further include a via connected to the gate wiring and the landing pads through the at least one second hole.

In some embodiments, the gate wiring, the source field plate, and the drain field plate may be sequentially arranged in the metal wiring layer.

In some embodiments, the HEMT may further include an other metal wiring layer on the metal wiring layer.

In some embodiments, the other metal wiring layer may include at least one other source field plate arranged in parallel with the source field plate, and at least one other drain field plate arranged in parallel with the drain field plate.

In some embodiments, the other metal wiring layer may include at least one other source field plate arranged perpendicularly to the source field plate, and at least one other drain field plate arranged perpendicularly to the drain field plate.

In some embodiments, the other metal wiring layer may include at least one other source field plate arranged obliquely at an angle less than 90 degrees with respect to the source field plate, and at least one other drain field plate arranged obliquely at an angle less than 90 degrees with respect to the drain field plate.

In some embodiments, the source field plate in the metal wiring layer may be a first source field plate and the metal wiring layer may further include a second source field plate in the same layer. The second source field plate may be spaced apart from the first source field plate and the drain field plate, The gate wiring may be between the first source plate and the second source plate. The gate wiring may be spaced apart from the first source plate and the second source plate. The second source field plate may be between the gate wiring and the drain field plate.

In some embodiments, the HEMT may further include a first via connecting the first source field plate to the source electrode and a second via connecting the second source field plate to the source electrode.

In some embodiments, the HEMT may further include a source contact connecting the barrier layer to the source electrode, a third via connecting the drain field plate to the drain electrode, and a fourth via connecting the gate wiring to the gate electrode. The gate electrode may include a first hole and landing pads provided on both sides of the first hole. The source contact may extend through the first hole. The source electrode may include a second hole. The fourth via may extend through the second hole.

In some embodiments, the HEMT may further include a p-GaN layer between the barrier layer and the gate electrode. The gate electrode and the p-GaN layer may be in direct contact with each other. The source contact may extend through the p-GaN layer to the barrier layer and the source contact may be spaced apart from the p-GaN layer.

In some embodiments, a thickness of the source contact may be equal to a thickness of the drain contact and a thickness of the first via may be equal to a thickness of the second via. The thickness of the first via may be equal to a thickness of the third via. The thickness of the source contact may be greater than a combined thickness of the gate electrode and the p-GaN layer.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
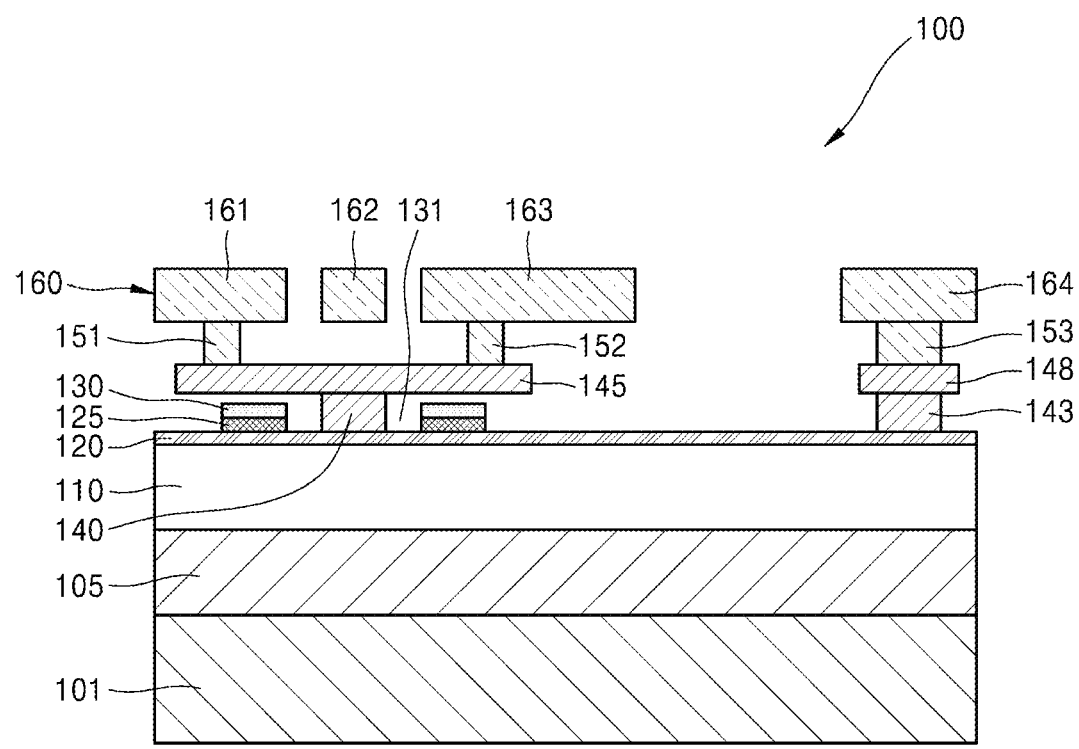
FIG. 1 is a schematic cross-sectional view showing a high electron mobility transistor (HEMT) according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" may include any and all combinations of one or more of the associated listed items. Expressions such as "at least one of," when preceding a list of elements, modify the entire list of elements and do not modify the individual elements of the list.

Hereinafter, a high electron mobility transistor (HEMT) according to various embodiments are described in detail with reference to the accompanying drawings. In the accompanying drawings, wherein like reference numerals refer to like elements throughout. Also, the size of each layer illustrated in the drawings may be exaggerated for convenience of explanation and clarity. Terms such as "first" and "second" are used herein merely to describe a variety of constituent elements, but the constituent elements are not limited by the terms. Such terms are used only for the purpose of distinguishing one constituent element from another constituent element.

An expression used in a singular form in the present specification also may include the expression in its plural form unless clearly specified otherwise in context. Throughout the specification, when a portion "includes" an element, another element may be further included, rather than excluding the existence of the other element, unless otherwise described. Also, the size or the thickness of each layer illustrated in the drawings may be exaggerated for clarity of explanation. Also, in the following description, when a material layer is described to exist on another layer, the material layer may exist directly on the other layer or a third layer may be interposed therebetween. Because a material forming each layer in the following embodiments is an example, other materials may be used therefor.

Terms such as a "portion", a "unit", a "module", and a "block" stated in the specification may signify a unit to process at least one function or operation and the unit may be embodied by hardware, software, or a combination of hardware and software.

The particular implementations shown and described herein are illustrative examples of the disclosure and are not intended to otherwise limit the scope of the disclosure in any way. For the sake of brevity, conventional electronics, control systems, software development and other functional aspects of the systems (and components of the individual operating components of the systems) may not be described in detail. Furthermore, the connecting lines, or connectors shown in the various figures presented are intended to represent functional relationships and/or physical or logical couplings between the various elements. It should be noted that many alternative or additional functional relationships, physical connections or logical connections may be present in a practical device.

The use of terms "a" and "an" and "the" and similar referents in the context of describing the disclosure (especially in the context of the following claims) are to be construed to cover both the singular and the plural.

The steps of all methods described herein may be performed in any suitable order unless otherwise indicated herein or otherwise clearly contradicted by context. The use of any and all examples, or language (e.g., "such as") provided herein, is intended merely to better illuminate the disclosure and does not pose a limitation on the scope of the disclosure unless otherwise claimed.

FIG. 1 is a schematic cross-sectional view of a high electron mobility transistor (HEMT) 100 according to an embodiment.

The HEMT 100 may include a substrate 101, a channel layer 110 provided on the substrate 101, a barrier layer 120 provided on the channel layer 110, a source contact 140 and a drain contact 143 that are provided on the barrier layer 120.

The substrate 101 may include at least one of Si, silicon on insulator (SOI), SiC, and GaN.

The channel layer 110 may include a III-V compound semiconductor, and, for example, the channel layer 110 may include GaN, InGaN, or AlGaN. However, the present disclosure is not limited thereto, and the channel layer 110 may be a material layer different from a semiconductor layer as long as a material may form 2-dimensional electron gas (2DEG). Meanwhile, GaN-based semiconductors have excellent properties such as a large energy band gap, high thermal and chemical stability, and a high electron saturation rate (~3×10$^7$ cm/sec), such that GaN-based semiconductors may be applied not only to optical devices, but also to electronic devices for high frequency and high power. Electronic devices using GaN-based semiconductors have various characteristics such as a high breakdown electric field (~3×10$^6$ V/cm), a high maximum current density, stable high-temperature operation characteristics, and a high thermal conductivity. In the case of the HEMT 100 using a GaN-based hetero-junction structure, because the band-discontinuity between the channel layer 110 and the channel supply layer is large, electrons may concentrate at a high concentration on a junction interface, thereby increasing electron mobility.

A buffer layer 105 may be further provided between the substrate 101 and the channel layer 110. The buffer layer 105 may include a III-V compound semiconductor.

The buffer layer 105 may be provided to limit and/or prevent a decrease in crystallinity of the channel layer 110 by reducing a difference in a lattice constant and a thermal expansion coefficient between the substrate 101 and the channel layer 110. The buffer layer 105 may include, for example, AlN, GaN, AlGaN, AlInN, or AlGaInN. The buffer layer 105 may include one layer or a plurality of layers. In some cases, a seed layer (not shown) may be further provided between the substrate 101 and the buffer layer 105. The seed layer may be a base layer for growth of the buffer layer 105. The substrate 101 and the buffer layer 105 may be removed after the HEMT 100 is manufactured. In other words, the substrate 101 and the buffer layer 105 may be selectively provided in the HEMT 100.

The barrier layer 120 may include a III-V compound semiconductor. The barrier layer 120 may include, for example, nitride including at least one of Al, Ga, and In, and may have a single layer or multilayer structure.

The barrier layer 120 may include any one of AlN, AlGaN, AlInN, AlGaInN, and combinations thereof. In addition, the barrier layer 120 may be doped in an n-type. The barrier layer 120 may include a material having polarization characteristics different from that of the channel layer 110. The barrier layer 120 may include a material with a larger band gap than that of the channel layer 110. FIG. 1 shows an example in which the barrier layer 120 includes one layer, but the barrier layer 120 may include a plurality of layers.

A 2DEG layer may be formed on a part of the channel layer 110. The 2DEG layer may be formed on the channel layer 110 by spontaneous polarization $P_{SP}$ and piezo polarization $P_{PE}$ due to tensile stress.

A gate electrode 130 may be provided on the barrier layer 120.

A source electrode 145 may be provided on the source contact 140 and may extend over (and/or on) gate electrode 130. In addition, a drain electrode 148 may be spaced apart from the source electrode 145.

When a gate voltage is 0V, for a normally off state in which no current flows between the drain electrode 148 and the source electrode 145, a p-GaN layer 125 may be further provided between the barrier layer 120 and the gate electrode 130.

A process of manufacturing the HEMT 100 may include a gate first process of first forming a gate electrode before an ohmic process, and an ohmic first process of performing an ohmic process before a gate electrode process. In the gate first process, the HEMT 100 may have a self-align gate structure in which the p-GaN layer 125 and the gate electrode 130 are etched. The p-GaN layer 125 and the gate electrode 130 may be etched at a same time and/or a same operation. The gate electrode 130 and the p-GaN layer 125 may be in direct contact. In the self-aligned gate structure, line width control may be easy, and the number of photomasks and process steps in the manufacturing process may be reduced, and thus production cost may be saved.

The p-GaN layer 125 may increase the size of a barrier with respect to electron conduction to or from an interface between the channel layer 110 and the barrier layer 120.

Because an ohmic process requiring a high temperature is performed after the gate electrode process, the gate electrode 130 may include a material capable of withstanding high temperature ohmic heat treatment. The gate electrode 130 may include, for example, at least one of Ti, TiN, TiAl, or W.

The gate electrode 130 may include at least one first hole 131. The first hole 131 may reduce a gate resistance by reducing the area of the gate electrode 130. A source contact 140 may be provided in the first hole 131. A drain contact 143 may be spaced apart from the gate electrode 130. The source contact 140 may be provided between the barrier layer 120 and the source electrode 145. A drain contact 143 may be provided between the barrier layer 120 and the drain electrode 148. The source electrode 145 and the drain electrode 148 may include, for example, Ti/Al/Ti, TiN, Ti/Si/Ni, Ti/Al/Ni, and the like.

The source electrode 145 and the drain electrode 148 may be provided on the same layer. In other words, the source electrode 145 and the drain electrode 148 may be provided at the same height from the barrier layer 120.

The source electrode 145 may be provided over the gate electrode 130, and the source electrode 145 may have a larger width than the gate electrode 130. For example, the source electrode 145 may be disposed to entirely cover the gate electrode 130. One side of the source electrode 145 may extend longer than one side of the gate electrode 130. Therefore, a distance from one side of the source electrode 145 to the drain electrode 148 may be smaller than a distance from one side of the gate electrode 130 to the drain electrode 148. However, the arrangement of the source electrode 145 is not limited thereto.

A metal wiring layer 160 may be further provided on the source electrode 145 and the drain electrode 148. At least one source field plate, at least one gate wiring, and at least one drain field plate may be provided on the metal wiring layer 160.

The at least one source field plate may be provided on the source electrode 145. The at least one source field plate may include, for example, a first source field plate 161 and a second source field plate 163. A gate wiring 162 may be provided between the first source field plate 161 and the second source field plate 163. A drain field plate 164 may be provided on the drain electrode 148.

A field plate may form a peak electric field that reduces impact due to the electric field of the increased gate capacitance. The electric field disperses in the gate and drain regions by the field plate, and thus the peak electric field may be reduced and the gate leakage current may be reduced while maintaining high frequency performance, thereby obtaining a high breakdown voltage. In addition, the capacitance between gate and drain may be reduced due to a shielding effect, and high power and high frequency characteristics may be improved.

The first source field plate 161, the gate wiring 162, the second source field plate 163, and the drain field plate 164 may be provided on the same layer. In other words, the first source field plate 161, the gate wiring 162, the second source field plate 163, and the drain field plate 164 may be provided at the same height from the barrier layer 120. In addition, the gate wiring 162, the second source field plate 163, and the drain field plate 164 may be arranged sequentially.

The gate wiring 162 may include metal with a low resistance, thereby reducing the gate resistance. In addition, the first and second source field plates 161 and 163 and the drain field plate 164 may disperse a gate edge field to a drift region, thereby reducing a voltage leakage.

In an embodiment, the gate wiring 162 for reducing gate resistance and the field plate with a field plate function may be provided on the same layer. Thus, compared to the case where the gate wiring and the field plate are provided in different layers, the operations in the manufacturing process may be reduced and the gate resistance may be reduced.

FIGS. 2 to 6 are schematic plan views showing each layer of a HEMT according to an embodiment.

Figure 2:
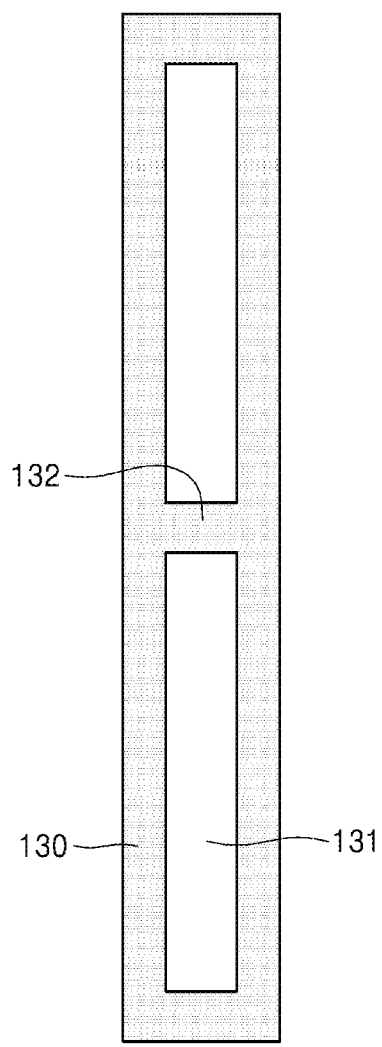
FIG. 2 is a plan view showing each layer of a HEMT according to an embodiment.

Referring to FIG. 2, the gate electrode 130 may include the at least one first hole 131. The gate electrode 130 may include a landing pad 132 between the at least one adjacent first holes 131. The landing pad 132 may be connected to the gate wiring 162 through a gate via which will be described later. Although only the gate electrode 130 is shown in FIG. 2, referring to FIG. 1, the p-GaN layer 125 and the gate electrode 130 may be sequentially stacked on the barrier layer 120. The p-GaN layer 125 and the gate electrode 130 may be self-aligned in a single etching process before an ohmic process.

Figure 3:
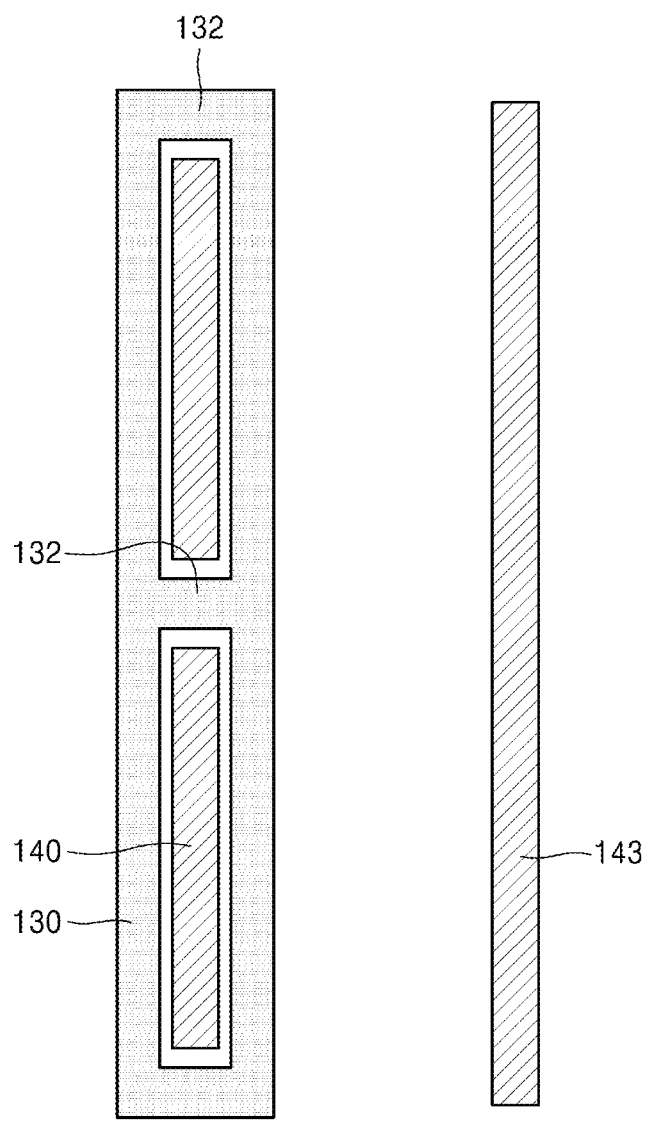
FIG. 3 is a plan view showing a source contact and a drain contact of a HEMT according to an embodiment.

Referring to FIG. 3, the source contact 140 may be provided in the first hole 131 of the gate electrode 130, and the drain contact 143 may be spaced apart from the gate electrode 130. The source contact 140 and the drain contact 143 may be formed by an ohmic contact process.

Again, referring to FIG. 1, upper surfaces of the source contact 140 and the drain contact 143 may be located higher than the upper surface of the gate electrode 130.

Figure 4:
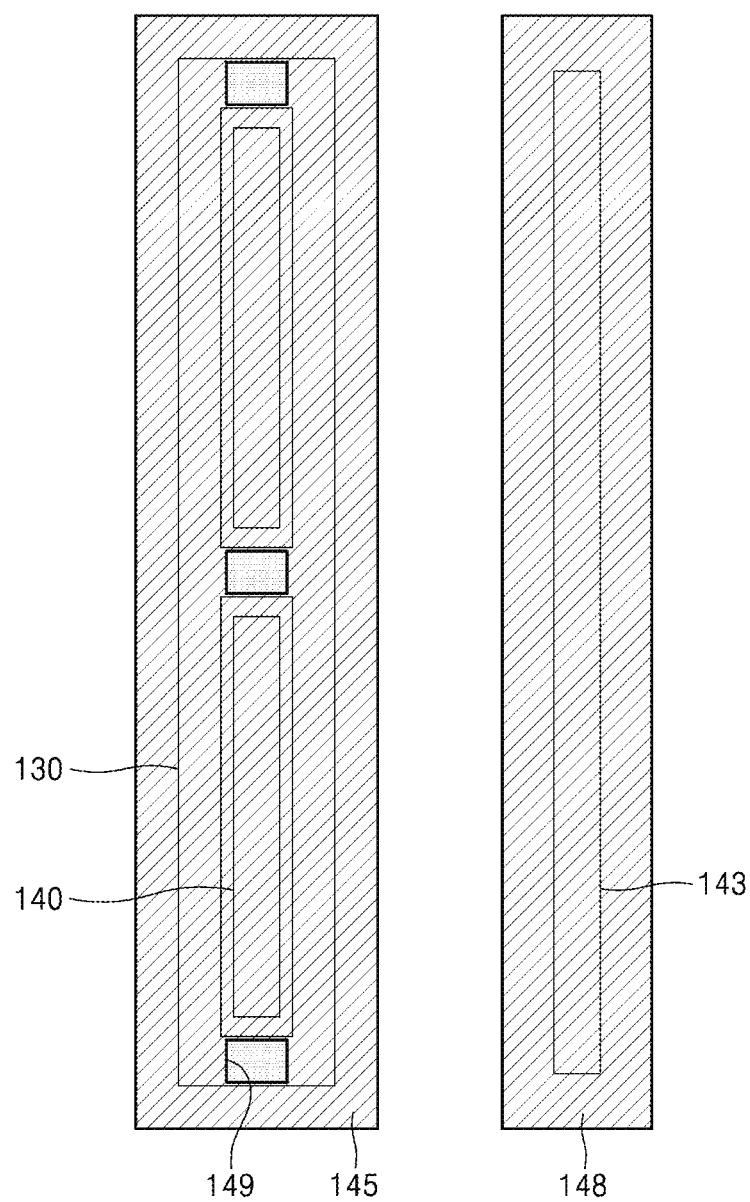
FIG. 4 is a plan view showing a source electrode and a drain electrode of a HEMT according to an embodiment.

Referring to FIG. 4, a source electrode 145 may be provided in and/or on the source contact 140, and the drain electrode 148 may be provided in and/or on the drain contact 145. The source electrode 145 and the drain electrode 148 may be spaced apart on the same layer.

The source electrode 145 may include at least one second hole 149. The second hole 149 may correspond to the landing pad 132 of the gate electrode 130. The landing pad 132 may be exposed through a second hole 149. The source electrode 145 may entirely cover the gate electrode 130. The source electrode 145 may be coupled to the source contact 140 and may be spaced apart from the gate electrode 130. The drain electrode 148 may be coupled to the drain contact 143 and may be spaced apart from the gate electrode 130.

Figure 5:
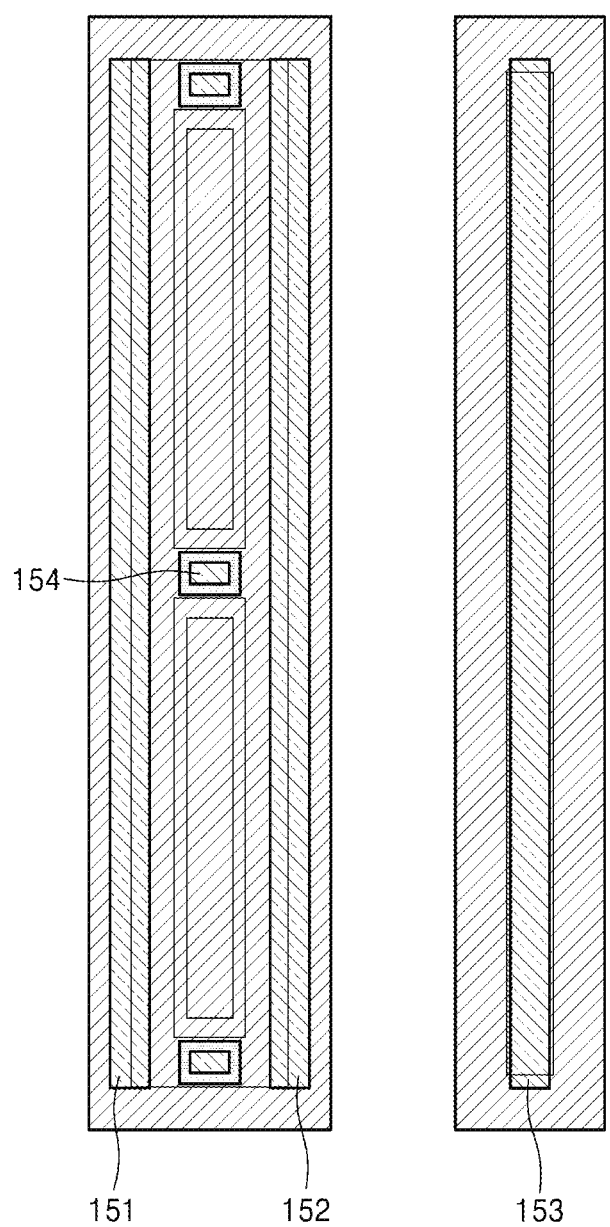
FIG. 5 is a plan view showing a via structure of a HEMT according to an embodiment.

Referring to FIG. 5, a first via 151 and a second via 152 may be connected to the source electrode 145. The first via 151 and the second via 152 may be, for example, spaced apart from each other and arranged in parallel. However, the locations of the first via 151 and the second via 152 are not limited thereto and may be variously arranged.

A third via 153 may be connected to the drain electrode 148. The third via 153 may be spaced apart from the second via 152 and arranged parallel to each other. A fourth via 154 may be connected to the gate electrode 130. The fourth via 154 may be coupled to the landing pad 132 of the gate electrode 130 through the second hole 149.

Figure 6:
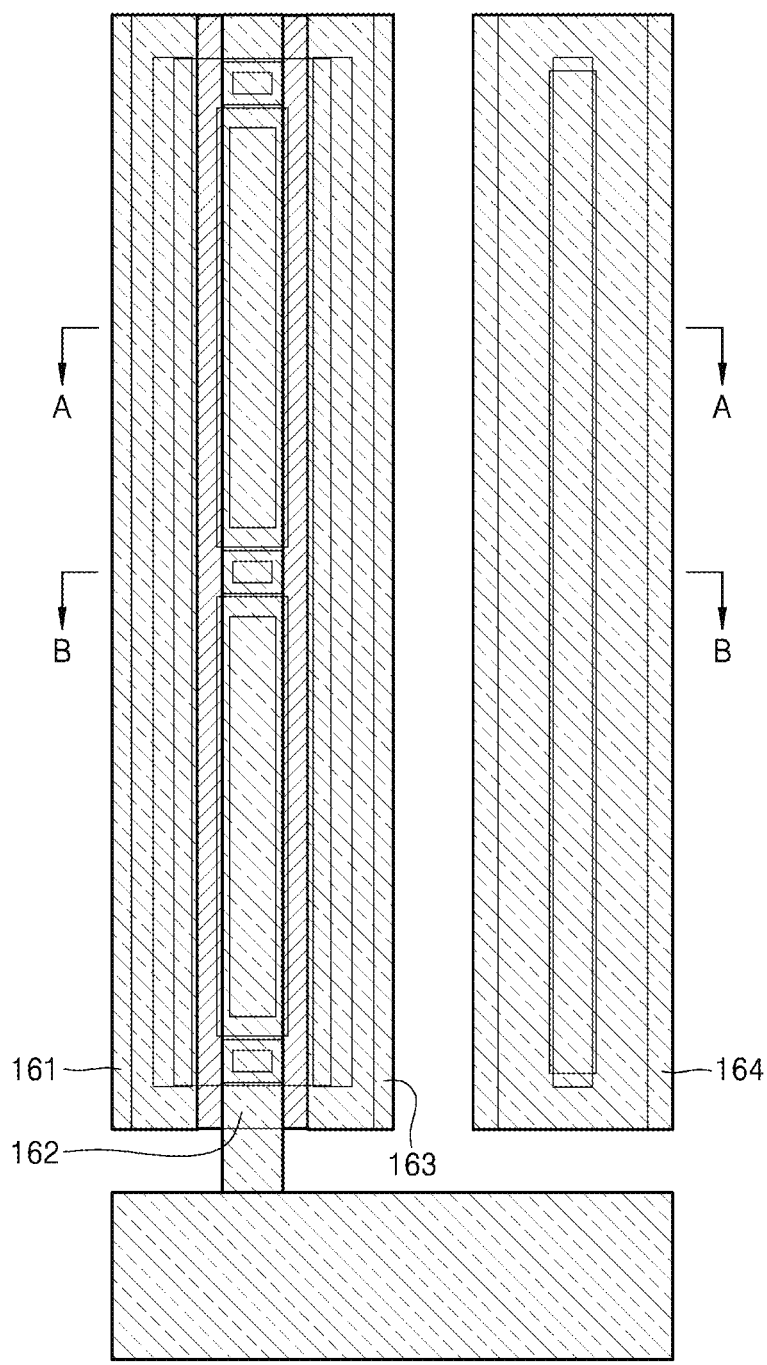
FIG. 6 is a plan view showing a metal wiring layer of a HEMT according to an embodiment.

Referring to FIG. 6, the first source field plate 161, the gate wiring 162, the second source field plate 163, and he drain field plate 164 may be provided on the same layer. The first source field plate 161, the gate wiring 162, the second source field plate 163, and he drain field plate 164 may be spaced apart from each other and arranged in parallel. However, the structure or arrangement relationship of the first source field plate 161, the gate wiring 162, the second source field plate 163, and the drain field plate 164 is not limited thereto.

The first source field plate 161 may be connected to the source electrode 145 through the first via 151, and the second source field plate 163 may be connected to the source electrode 145 through the second via 152. The drain field plate 164 may be connected to the drain electrode 148 through the third via 153. The gate wiring 162 may be connected to the gate electrode 130 through the fourth via 154.

In an embodiment, an increase in the gate resistance due to the material limit may be compensated in the gate first structure without an increase in the number of layers, by providing the first and second source field plates 161 and 163, the gate wiring 162, and the drain field plate 164 on the same layer.

Figure 7:
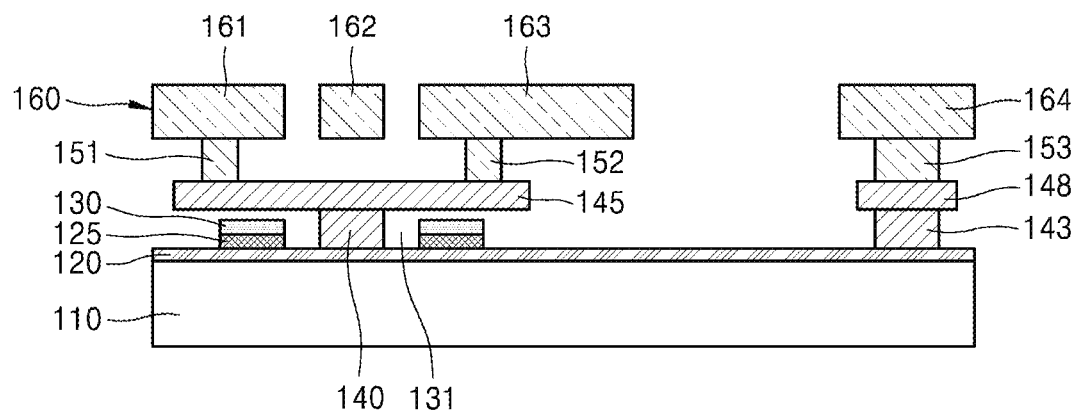
FIG. 7 is a cross-sectional view taken along line A-A of FIG. 6.
Figure 8:
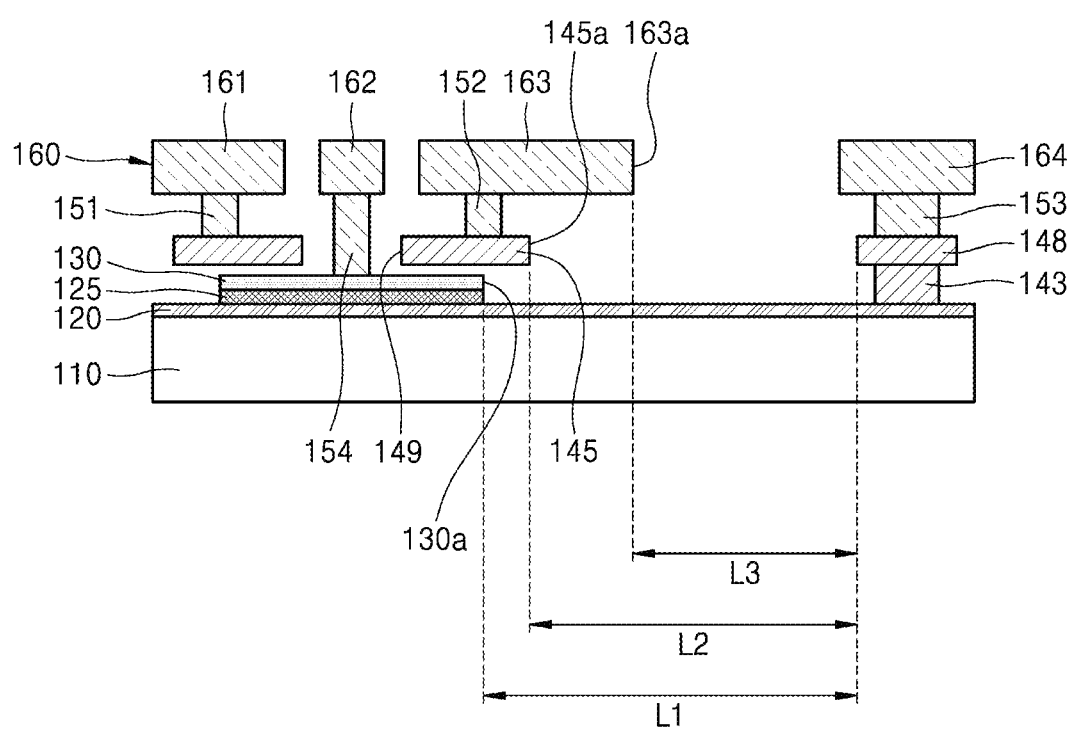
FIG. 8 is a cross-sectional view taken along line B-B of FIG. 6.

FIG. 7 is a cross-sectional view taken along line A-A of FIG. 6 and FIG. 8 is a cross-sectional view taken along line B-B of FIG. 6.

Referring to FIG. 7, the source electrode 145 may be in ohmic contact with the source contact 140 provided in the first hole 131 of the gate electrode 130. The gate electrode 130 may be provided on a lower portion of the source electrode 145.

Referring to FIG. 8, the gate wiring 162 may be connected to the gate electrode 154 through the fourth via 154 provided in the second hole 149 of the source electrode 145. In addition, when a distance from one side portion 130a of the gate electrode 130 to the drain electrode 148 is denoted by L1, a distance from the one side portion 145a of the source electrode 145 to the drain electrode 148 is denoted by L2, and a distance from one side portion 163a of the source field plate 163 to the drain electrode 148 is denoted by L3, a relationship of L1>L2>L3 may be established. Here, the distance represents the vertical distance between extension lines passing through side portions.

Figure 9:
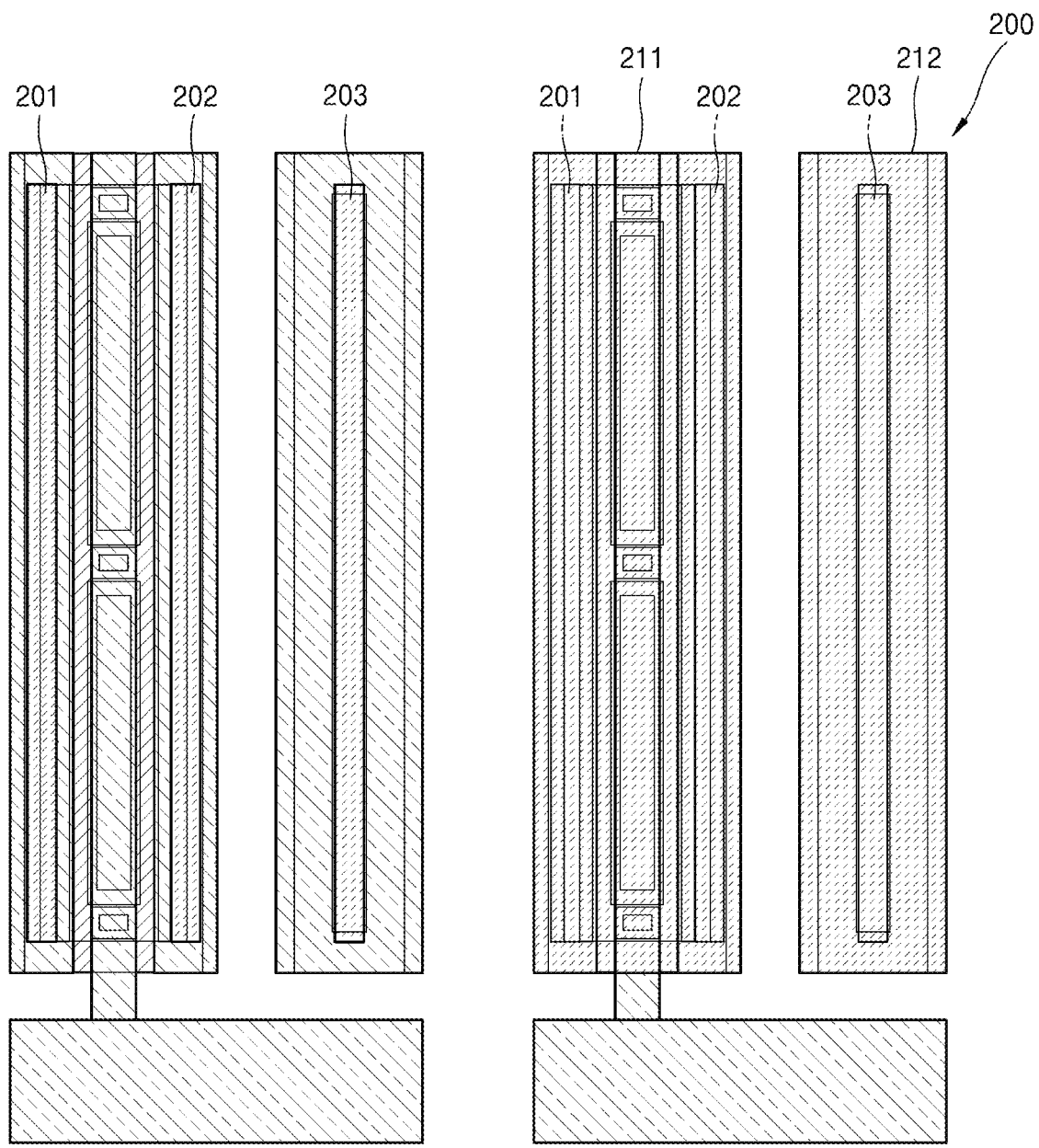
FIGS. 9 to 11 show examples of different metal wiring layers of a HEMT according to embodiments.

FIG. 9 shows an example in which a metal wiring layer 200 is further provided on the HEMT shown in FIG. 6.

The metal wiring layer 200 may be connected to the first source field plate 161, the second source field plate 163, and the drain field plate 164 through a plurality of vias.

A via structure is shown on the left side of FIG. 9, and the metal wiring layer 200 is shown on the right side.

Referring to FIGS. 8 and 9, a fifth via 201 may be provided in the first source field plate 161, and a sixth via 202 may be provided in the second source field plate 163. In addition, a seventh via 203 may be provided in the drain field plate 164.

The metal wiring layer 200 may include a third source field plate 211 and a first drain field plate 212. The third source field plate 211 may be coupled to the fifth via 201 and the sixth via 202, and the first drain field plate 212 may be coupled to the seventh via 203.

The third source field plate 211 may be disposed in parallel in the same direction as the first and second source field plates 161 and 163.

Figure 10:
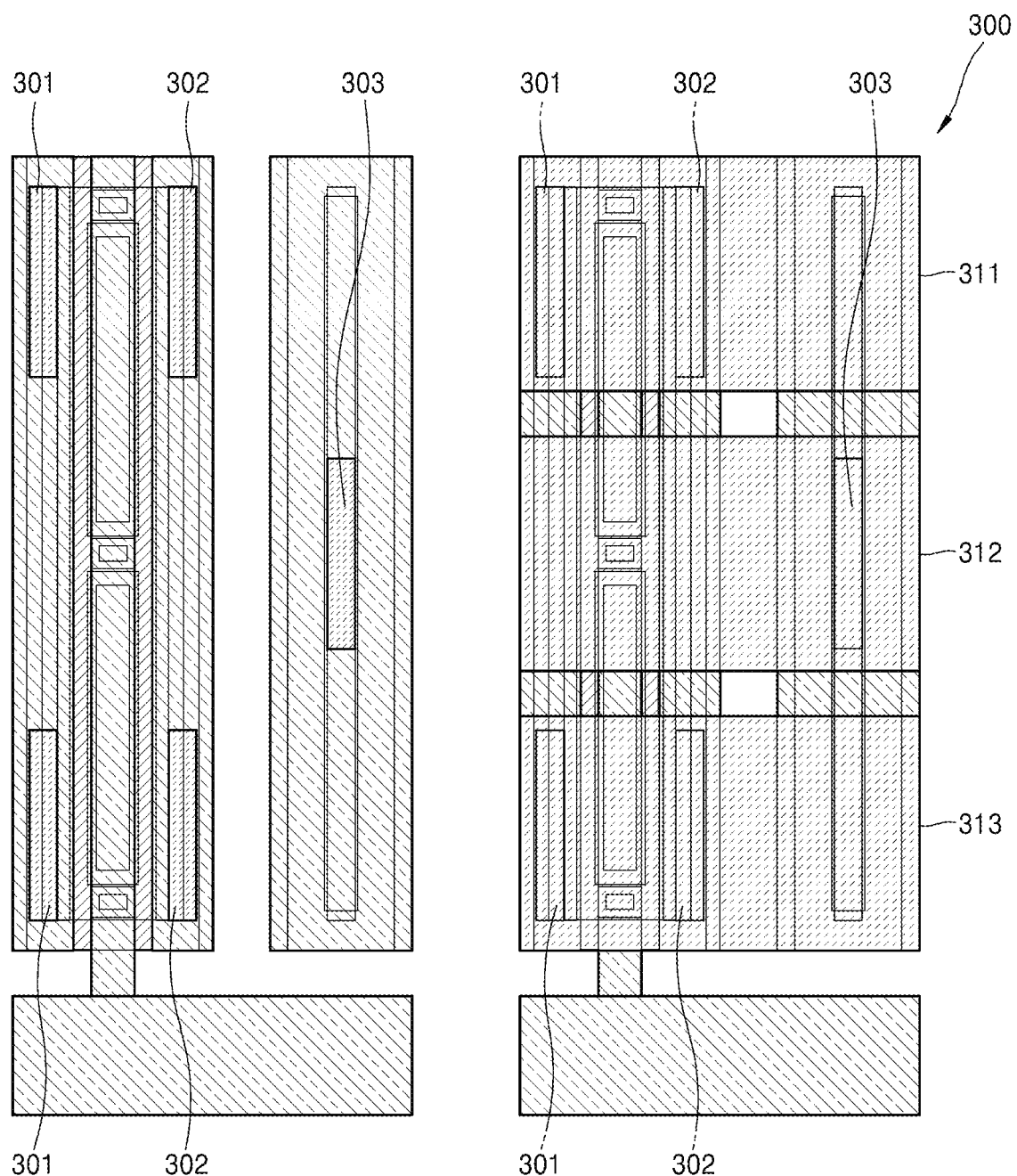

FIG. 10 shows another example in which a metal wiring layer 300 is further provided on the HEMT shown in FIG. 6.

The metal wiring layer 300 may be connected to the first source field plate 161, the second source field plate 163, and the drain field plate 164 through a plurality of vias.

The via structure is shown on the left side of FIG. 10, and the metal wiring layer 300 is shown on the right side.

Referring to FIGS. 8 and 10, at least one eighth via 301 may be provided in the first source field plate 161, and at least one ninth via 302 may be provided in the second source field plate 163. In addition, at least one tenth via 303 may be provided in the drain field plate 164.

At least one eighth via 301 and at least one ninth via 302 may be provided in parallel. The at least one tenth via 303 may be disposed so as not to face the at least one eighth via 301 and the at least one ninth via 302.

The metal wiring layer 300 may include a fourth source field plate 311, a second drain field plate 312 and a fifth source field plate 313. The fourth source field plate 311, the second drain field plate 312 and the fifth source field plate 313 may be arranged in a direction perpendicular to the arrangement direction of the first source field plate 161, the second source field plate 163, and the drain field plate 164. The second drain field plate 312 may be provided between the fourth source field plate 311 and the fifth source field plate 313. The second drain field plate 312, the fourth source field plate 311, and the fifth source field plate 313 may be arranged side by side.

The fourth source field plate 311 may be coupled to the eighth via 301 and the ninth via 302 in the upper portion of FIG. 10, and the fifth source field plate 313 may be coupled to the eighth via 301 and the ninth via 302 in the lower portion of FIG. 10. In addition, the second drain field plate 312 may be coupled to the tenth via 303.

Figure 11:
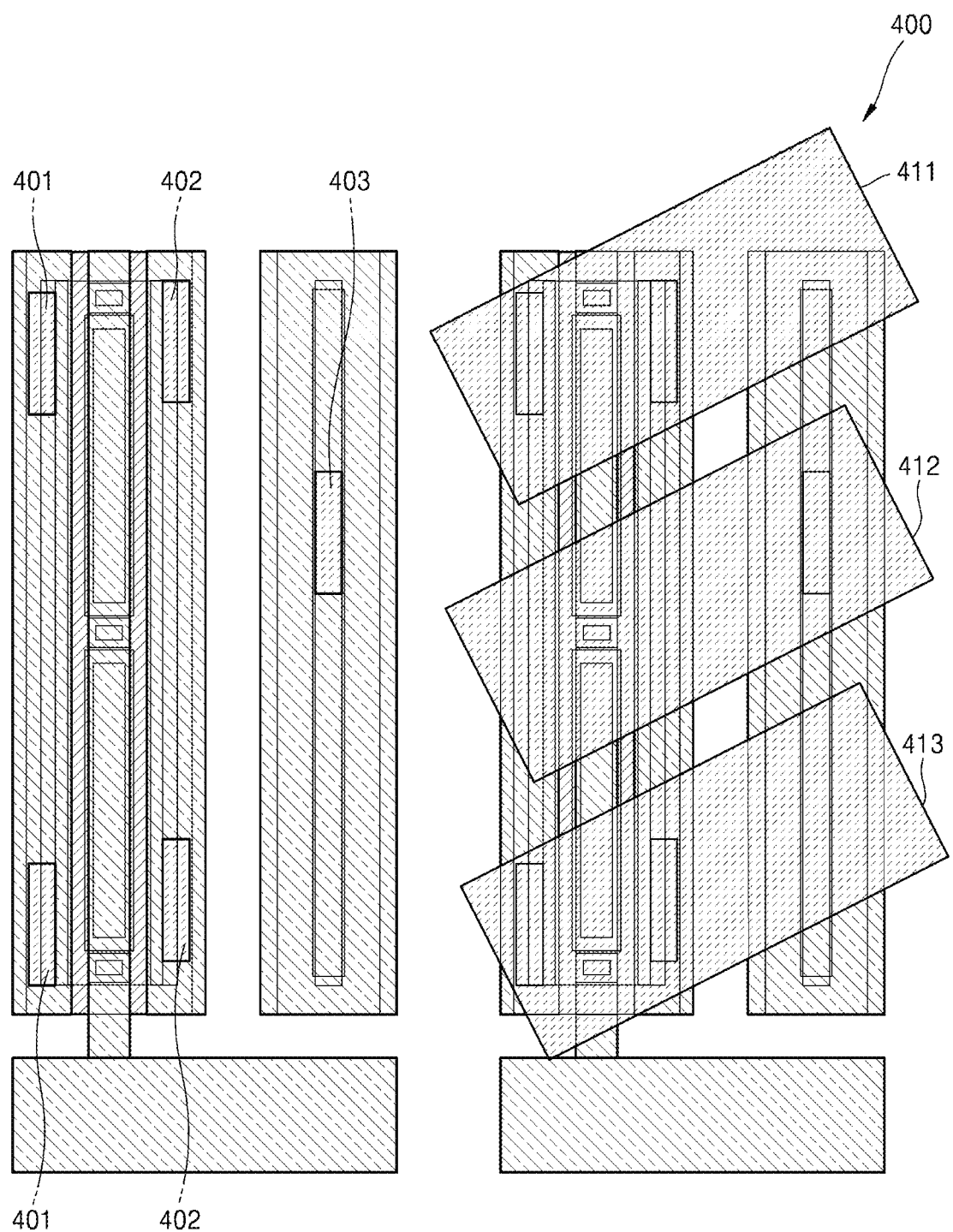

FIG. 11 shows another example in which a metal wiring layer 400 is further provided on the HEMT shown in FIG. 6.

The metal wiring layer 400 may be connected to the first source field plate 161, the second source field plate 163, and the drain field plate 164 through a plurality of vias.

A via structure is shown on the left side of FIG. 11, and the metal wiring layer 400 is shown on the right side.

Referring to FIGS. 8 and 11, at least one eleventh via 401 may be provided in the first source field plate 161, and at least one twelfth via 402 may be provided in the second source field plate 163. In addition, at least one twelfth via 403 may be provided in the drain field plate 164.

The at least one eleventh via 401 and the at least one twelfth via 402 may be provided in parallel. The at least one eleventh via 401 may be disposed to partially face the at least one twelfth via 402. That is, the at least one eleventh via 401 may be misaligned with the at least one twelfth via 402. In addition, the at least one thirteenth via 403 may be disposed so as not to face the at least one eleventh via 401 and the at least one twelfth via 402.

The metal wiring layer 400 may include a sixth source field plate 411, a third drain field plate 412, and a seventh source field plate 413. The sixth source field plate 411, the third drain field plate 412 and the seventh source field plate 413 may be arranged obliquely with an angle less than 90 degrees with respect to the arrangement direction of the first source field plate 161, the second source field plate 163, and the drain field plate 164 The fourth drain field plate 412 may be provided between the sixth source field plate 411 and the seventh source field plate 413. The fourth drain field plate 412, the sixth source field plate 411, and the seventh source field plate 413 may be arranged side by side. However, the arrangement direction is not limited thereto.

The sixth source field plate 411 may be coupled to the eleventh via 401 and the twelfth via 402 in the upper portion of FIG. 11, and the seventh source field plate 413 may be coupled to the eleventh via 401 and the twelfth via 402 in the lower portion of FIG. 11. In addition, the third drain field plate 412 may be coupled to the thirteenth via 403.

A gate voltage leakage may be reduced through field plates provided in the metal wiring layer 400 and reliability of a short circuit may increase. By reducing the gate resistance, the switching time may be shortened and the switching loss may be reduced.

The HEMT according to an embodiment may be applied to a high power and high integration transistor, switch, a power amplifier, a microwave monolithic integrated circuit (MMIC), etc. by hetero-junction of a III-V compound semiconductor.

The HEMT according to an embodiment of the present disclosure has been described with reference to the embodiment shown in the drawings for better understanding, but this is only an example, and it will be understood by those of ordinary skill in the art that various modifications therefrom and equivalent other embodiments are possible. Therefore, the true technical protection scope of the present disclosure should be determined by the appended claims.

The HEMT according to an embodiment may reduce gate resistance. The HEMT according to an embodiment may have a self-align gate structure by using a gate first process of forming a gate electrode before an ohmic process. The HEMT according to an embodiment may arrange a field plate and a gate wiring on the same layer while having the self-align gate structure, thereby reducing the number of layers and the gate resistance.

The above-described HEMT are applicable to various types of high power devices and electronic devices including the same.

Figure 12:
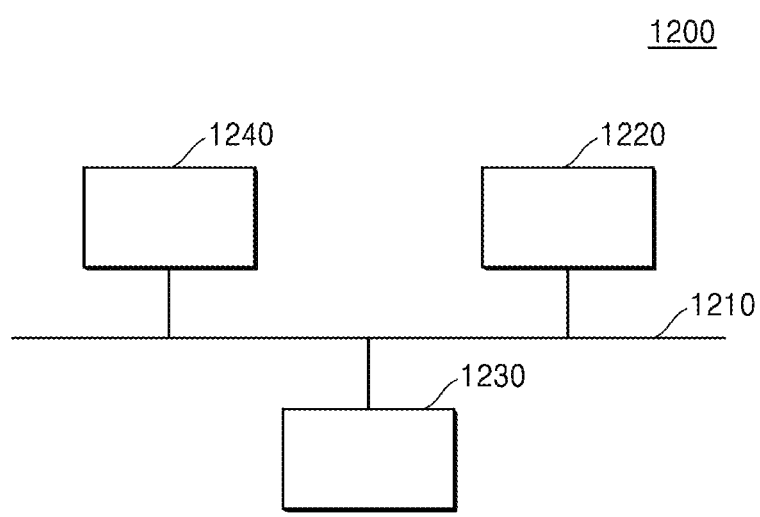
FIG. 12 is a schematic of an electronic device according to an embodiment.

FIG. 12 is a schematic of an electronic device according to an embodiment.

As shown, the electronic device 1200 includes one or more electronic device components, including a processor (e.g., processing circuitry) 1220 and a memory 1230 that are communicatively coupled together via a bus 1210.

The processing circuitry 1220, may be included in, may include, and/or may be implemented by one or more instances of processing circuitry such as hardware including logic circuits, a hardware/software combination such as a processor executing software; or a combination thereof. For example, the processing circuitry 1220 may include, but is not limited to, a central processing unit (CPU), an application processor (AP), an arithmetic logic unit (ALU), a graphic processing unit (GPU), a digital signal processor, a microcomputer, a field programmable gate array (FPGA), a System-on-Chip (SoC) a programmable logic unit, a microprocessor, or an application-specific integrated circuit (ASIC), etc. In some example embodiments, the memory 1230 may include a non-transitory computer readable storage device, for example a solid state drive (SSD), storing a program of instructions, and the processing circuitry 1220 may be configured to execute the program of instructions to implement the functionality of the electronic device 1200.

In some example embodiments, the electronic device 1200 may include one or more additional components 1240, coupled to bus 1210, which may include, for example, a power supply, a light sensor, a light-emitting device, any combination thereof, or the like. In some example embodiments, one or more of the processing circuitry 1220, memory 1230, or one or more additional components 1240 may include a HEMT according to any of the embodiments described herein, such as the HEMTs and feature thereof in FIGS. 1 to 8 and 9 to 11 of the present application, such that the one or more of the processing circuitry 1220, memory 1230, or one or more additional components 1240, and thus, the electronic device 1200, may have a power device including a HEMT with a reduced gate resistance, and thus providing an electronic device 1200 having improved electrical characteristics and thus improved performance and/or reliability.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of inventive concepts as defined by the following claims.

What is claimed is:

1. A high electron mobility transistor (HEMT) comprising:
   a channel layer including a group III-V compound semiconductor;
   a barrier layer on the channel layer, the barrier layer including the group III-V compound semiconductor;
   a gate electrode on the barrier layer;
   a source electrode over the gate electrode;
   a drain electrode spaced apart from the source electrode; and
   a metal wiring layer including a gate wiring connected to the gate electrode, a source field plate connected to the source electrode, and a drain field plate connected to the drain electrode,
      the gate wiring, the source field plate, and the drain field plate being arranged in a same layer, wherein
   the gate electrode comprises at least one first hole and landing pads provided on both sides of the at least one first hole,
   the source electrode overlaps the gate electrode in a direction perpendicular to an upper surface of the barrier layer, and
   an entirety of the first hole is surrounded by the gate electrode.

2. The HEMT of claim 1, wherein a distance from the source field plate to the drain electrode is shorter than a distance from the gate electrode to the drain electrode.

3. The HEMT of claim 1, wherein a distance from the source electrode to the drain electrode is shorter than a distance from the gate electrode to the drain electrode.

4. The HEMT of claim 1, wherein the gate electrode is selected from the group consisting of at least one of Ti, TiN, TiAl, and W.

5. The HEMT of claim 1, wherein the channel layer is selected from the group consisting of at least one of GaN, InGaN, and AlGaN.

6. The HEMT of claim 1, wherein the barrier layer is selected from the group consisting of at least one of AlN, AlGaN, AlInN, and AlInGaN.

7. The HEMT of claim 1, further comprising:
   a p-GaN layer between the barrier layer and the gate electrode.

8. The HEMT of claim 7, wherein the gate electrode and the p-GaN layer are in direct contact with each other and each have a self-align gate structure.

9. The HEMT of claim 1, wherein
   the at least one first hole includes two first holes spaced apart from each other in a first direction parallel to the upper surface of the barrier layer,
   the two first holes are entirely surrounded by the gate electrode,
   one of the landing pads is between the two first holes,
   the source field plate includes a first source field plate and a second source field plate spaced apart from each other in a second direction parallel to the upper surface of the barrier layer and crossing the first direction,
   the second source field plate is between the gate wiring and the drain field plate, and
   a minimum distance in the second direction between the second source field plate and the drain field plate is less than a minimum distance in the second direction between the source electrode and the drain electrode.

10. The HEMT of claim 1, further comprising:
    a source contact in the at least one first hole, wherein
    the source contact connects the barrier layer and the source electrode to each other.

11. The HEMT of claim 9, wherein the source electrode comprises at least one second hole.

12. The HEMT of claim 11, wherein the at least one second hole corresponds to the landing pads.

13. The HEMT of claim 12, further comprising:
    a via connected to the gate wiring and the landing pads through the at least one second hole.

14. The HEMT of claim 1, wherein the gate wiring, the source field plate, and the drain field plate are sequentially arranged in the metal wiring layer.

15. The HEMT of claim 1, further comprising:
    an other metal wiring layer on the metal wiring layer.

16. The HEMT of claim 15, wherein the other metal wiring layer comprises:
    at least one other source field plate arranged in parallel with the source field plate; and
    at least one other drain field plate arranged in parallel with the drain field plate.

17. The HEMT of claim 15, wherein the other metal wiring layer comprises:
    at least one other source field plate arranged perpendicularly to the source field plate; and
    at least one other drain field plate arranged perpendicularly to the drain field plate.

18. The HEMT of claim 15, wherein the other metal wiring layer comprises:
    at least one other source field plate arranged obliquely at an angle less than 90 degrees with respect to the source field plate; and
    at least one other drain field plate arranged obliquely at an angle less than 90 degrees with respect to the drain field plate.

19. The HEMT of claim 1, wherein
    the source field plate in the metal wiring layer is a first source field plate,
    the metal wiring layer further includes a second source field plate in a same layer,
    the second source field plate is spaced apart from the first source field plate and the drain field plate,
    the gate wiring is between the first source field plate and the second source field plate,
    the gate wiring is spaced apart from the first source field plate and the second source field plate, and the second source field plate is between the gate wiring and the drain field plate.

20. The HEMT of claim 19, further comprising:
a first via connecting the first source field plate to the source electrode; and
a second via connecting the second source field plate to the source electrode.

* * * * *